(12) United States Patent
Lamey

(10) Patent No.: US 6,222,236 B1
(45) Date of Patent: Apr. 24, 2001

(54) PROTECTION CIRCUIT AND METHOD FOR PROTECTING A SEMICONDUCTOR DEVICE

(75) Inventor: Daniel J. Lamey, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/302,537

(22) Filed: Apr. 30, 1999

(51) Int. Cl.$^7$ .................................................. H01L 23/62
(52) U.S. Cl. .......................... 257/355; 257/360; 361/91.5
(58) Field of Search .................................. 257/355, 360, 257/343, 378, 379, 408; 361/91.5

(56) References Cited

U.S. PATENT DOCUMENTS 5,578,860  11/1996  Costa et al. ........................ 257/528
6,169,312 * 1/2001  Hiraga ................................ 257/379

* cited by examiner

Primary Examiner—Mark V. Prenty
(74) Attorney, Agent, or Firm—Anthony M. Martinez

(57) ABSTRACT

An electrostatic discharge (ESD) protection circuit (20) includes an active load circuit (22) connected to a Laterally Diffused Metal Oxide Semiconductor (LDMOS) transistor (21) having a Lightly Doped Drain (LDD). The active load circuit includes a current limiting circuit (26) and a load transistor (27). The ESD protection circuit (20) operates to protect a power transistor (16) from damage due to an electrostatic charge. During an ESD event, the LDMOS transistor (21) enters avalanche breakdown after the voltage of the electrostatic charge exceeds the breakdown voltage of the LDMOS transistor (21). The ESD protection circuit (20) provides a low resistance path during an ESD event to dissipate the electrostatic charge.

18 Claims, 1 Drawing Sheet

PROTECTION CIRCUIT AND METHOD FOR PROTECTING A SEMICONDUCTOR DEVICE

FIELD OF THE INVENTION

The present invention relates, in general, to high voltage protection circuitry and, more particularly, to electrostatic discharge (ESD) protection circuits.

BACKGROUND OF THE INVENTION

It is well known that monolithic integrated circuits may become damaged by exposing their input or output terminals to large and sudden voltage transients such as electrostatic discharges. For example, a human body can accumulate enough charge to develop several thousand volts of potential, which can permanently damage an integrated circuit. When a charged object contacts the input or output terminals of the integrated circuit, the built-up electrostatic charge discharges and may force large currents into the integrated circuit. The large currents can rupture dielectric materials within the integrated circuits such as gate oxides or they may melt conductive materials such as polysilicon or aluminum interconnects, thereby irreparably damaging the integrated circuits.

Generally, integrated circuit manufacturers include high voltage protection circuits that shunt current away from input and output circuitry within integrated circuits to prevent the integrated circuits from being damaged by large voltage transients. One technique for protecting integrated circuits is to improve the energy dissipation capability of the protection circuitry. This is done by laying out the protection circuit to have larger geometries, wider metal interconnects, more and larger contacts, etc. A disadvantage of this approach is it increases the size of the integrated circuit and thus decreases the number of integrated circuits per semiconductor wafer, thereby increasing the cost of manufacturing the integrated circuits. In addition, larger geometries increase the capacitance of the Input/Output (I/O) terminals of the circuit being protected. This is undesirable for integrated circuits used in high frequency applications (e.g., applications such as cellular communications that operate between one megahertz (MHz) and two gigahertz (GHz)).

Accordingly, it would be advantageous to have a protection circuit for protecting high frequency integrated circuits from large voltage transients. It would be of further advantage for the protection circuit to occupy a small area and be compatible with standard semiconductor processes.

DETAILED DESCRIPTION OF THE DRAWINGS

Figure 1:
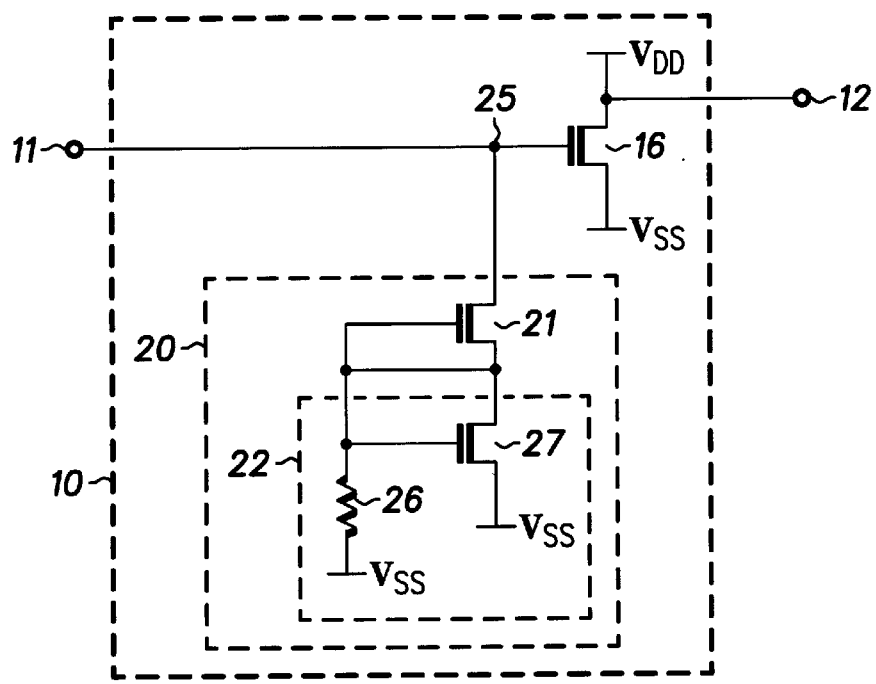
FIG. 1 is a schematic diagram of an integrated circuit that includes a protection circuit.

FIG. 1 is a schematic diagram of integrated circuit 10 having an input terminal 11 for receiving an input signal and an output terminal 12 for providing an output signal. Integrated circuit 10 includes a semiconductor device such as, for example, a high frequency power transistor 16 and a electrostatic discharge (ESD) protection circuit 20 that operates to protect transistor 16 from damage due to electrostatic discharge.

There is a maximum voltage on terminal 11 that power transistor 16 can be subjected without incurring damage. A voltage in excess of this amount can electrically stress power transistor 16 and cause permanent damage. This maximum voltage is designated herein as the stress voltage of power transistor 16, and refers to the voltage level above which power transistor 16 can sustain short or long term damage or reduced reliability. For example, the stress voltage of a Metal Oxide Semiconductor (MOS) transistor may be set by the maximum voltage that can be applied across the gate oxide of the transistor. If the stress voltage is exceeded, the gate oxide can rupture and permanently damage the transistor. If the gate potential is maintained below the stress voltage, damage will not occur.

It should be noted that other damage mechanisms besides ruptured gate oxides are known and have been quantified to determine a device's stress voltage. Moreover, voltages above a device's stress voltage need not result in an immediate failure of the device. Such a voltage may weaken the device and result in a failure at a later time, which effectively reduces the device's reliability. Device damage can be avoided when circuit voltages are maintained at magnitudes less than the stress voltage.

Protection circuit 20 is coupled to terminal 11 to protect power transistor 16 by removing electrostatic charge at its gate electrode before the gate potential can rise to a value above the stress voltage and damage power transistor 16.

By way of example, transistor 16 is a Laterally Diffused Metal Oxide Semiconductor (LDMOS) power transistor. The gate electrode of transistor 16 is connected to input terminal 11. The drain electrode of transistor 16 is connected to output terminal 12 and is coupled for receiving a source of operating potential or power supply voltage such as, for example, supply voltage $V_{DD}$. The source electrode of transistor 16 is coupled for receiving a power supply voltage such as, for example, supply voltage $V_{SS}$. Supply voltage $V_{DD}$ is, for example, twenty-eight volts and supply voltage $V_{SS}$ is zero volts.

Protection circuit 20 includes a transistor 21 connected to an active load circuit 22. Active load circuit 22 includes at least one active element. In the embodiment shown in FIG. 1, active load circuit 22 includes an n-channel Metal Oxide Semiconductor Field Effect Transistor (MOSFET) 27 and a resistor 26. Transistor 27 is referred to as a load transistor.

The drain electrode of transistor 21 is connected to the gate electrode of transistor 16 to form a node 25. The gate electrode of transistor 21 is commonly connected to the source electrode of transistor 21, the drain and gate electrodes of transistor 27, and the first terminal of resistor 26. The second terminal of resistor 26 and the source electrode of transistor 27 are coupled to a power supply terminal for receiving power supply voltage $V_{SS}$.

Although transistor 27 is shown as a MOS transistor, this is not a limitation of the present invention. For example, transistor 27 can be a bipolar transistor. Transistors used in integrated circuit 10 are understood to provide a conduction path between first and second conduction electrodes when a control signal is applied to a control electrode. A channel region formed between the drain and source electrodes provides the conduction path whose conduction is modulated or enabled in accordance with the magnitude of the control signal. In addition, the conduction path of a MOS transistor can be enabled by applying a voltage in excess of the drain to source breakdown voltage of the MOS transistor.

It should be noted that the gate electrode of a MOS transistor is referred to as a control electrode and the drain and source electrodes of a MOS transistor are referred to as current carrying electrodes or conduction electrodes. Likewise, the base of a bipolar transistor is referred to as the control electrode and the collector and emitter electrodes of the bipolar transistor are referred to as conduction electrodes.

Figure 2:
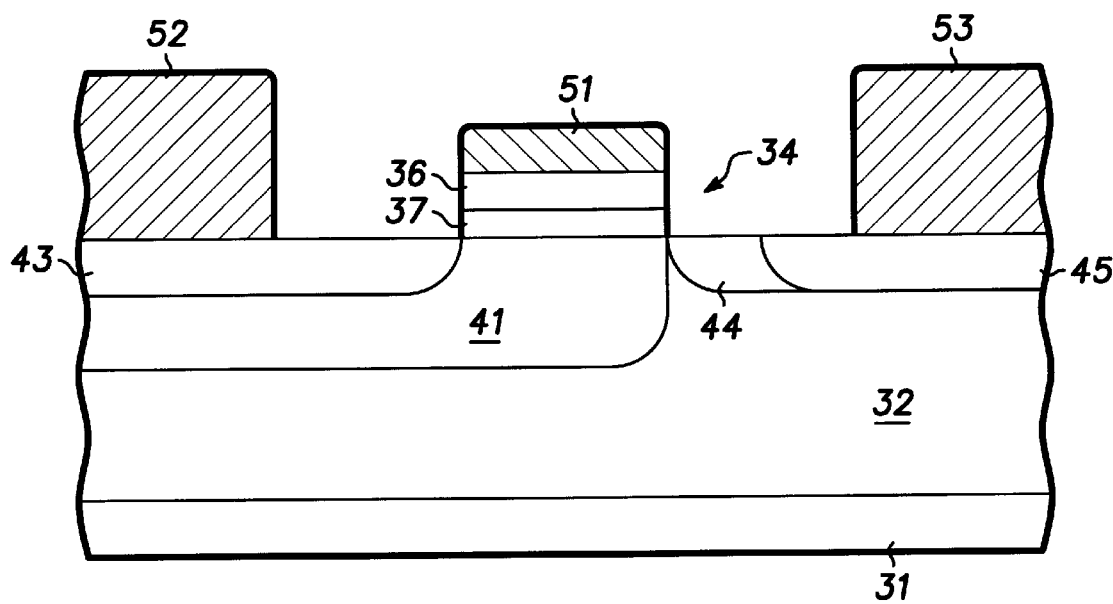
FIG. 2 is a cross-sectional view of a portion of the protection circuit of FIG. 1.

Transistor 21 is a LDMOS transistor having a Lightly Doped Drain (LDD) extension region as shown in FIG. 2. FIG. 2 is a cross-sectional view of LDMOS transistor 21 of protection circuit 20 in accordance with an embodiment of the present invention. Transistor 21 includes a semiconductor substrate 31 of P conductivity type. Alternatively, substrate 31 can be of N conductivity type. An epitaxial layer 32 of P conductivity type is formed on substrate 31.

A gate structure 34 is formed over epitaxial layer 32. Gate structure 34 includes a layer 36 of polysilicon formed over a layer 37 of dielectric material such as, for example, oxide. A suitable technique for forming oxide layer 37 is thermal oxidation and a suitable process for forming layer 36 includes chemical vapor deposition. Layers 36 and 37 are patterned to form gate structure 34 using photolithographic and etch techniques. Gate structure 34 has a gate length of approximately 1 micron. Oxide layer 37 is also referred to as a gate oxide layer.

A doped region 41 is formed by doping a portion of epitaxial layer 32 with an impurity material of P conductivity type such as, for example, boron. Doped region 41 is formed in layer 32 by diffusion. Alternatively, doped region 41 can be formed by ion implantation. Doped region 41 has a doping concentration ranging between approximately $1 \times 10^{15}$ atoms per cubic centimeter (atoms/cm$^3$) and approximately $1 \times 10^{18}$ atoms/cm Doped regions 43, 44, and 45 are preferably formed in epitaxial layer 32 by implanting an N-type impurity material such as, for example, arsenic. Doped region 44 is located between regions 41 and 45 and is spaced apart from region 43 by region 41. Preferably, the doping concentration of region 44 is less than the doping concentration of region 45. For example, doped regions 43 and 45 have a doping concentration ranging between approximately $1 \times 10^{19}$ atoms/cm$^3$ and approximately $1 \times 10^{21}$ atoms/cm$^3$. Doped region 44 has a doping concentration of less than approximately $1 \times 10^{17}$ atoms/cm$^3$ and is referred to as a Lightly Doped Drain (LDD) extension region. Region 44 has an extension length of approximately 0.5 microns.

A layer 51 of conductive material is disposed over polysilicon layer 36 to form an ohmic contact with polysilicon layer 36. Layer 51 serves as the gate electrode of transistor 21. The source electrode of transistor 21 is formed by disposing a layer 52 of conductive material over a portion of doped region 43. The drain electrode of transistor 21 is formed by disposing a layer 53 of conductive material over a portion of doped region 45. It should be understood that layers 51, 52, and 53 can be formed by disposing a single layer of conductive material and patterning this layer to form layers 51, 52, and 53. Suitable conductive materials for conductive layers 51, 52, and 53 include tungsten, tungsten alloys, copper, aluminum, copper alloys, aluminum alloys, or the like.

The drain of transistor 21 includes LDD extension region 44, more heavily doped region 45, and layer 53. The source of transistor 21 includes doped region 43 and layer 52. Doped region 41 serves as the channel region of transistor 21. The gate of transistor 21 include gate structure 34 and layer 51. The conduction path of transistor 21 includes layer 53, epitaxial layer 32, regions 45, 44, 41, and 43, and layer 52.

LDD extension region 44 increases the drain to source avalanche breakdown voltage (BVDSS) of transistor 21 compared to a conventional MOS transistor. In addition, the presence of LDD extension region 44 reduces the drain to source capacitance of transistor 21. A conventional MOS transistor, such as transistor 27 of protection circuit 20, does not include a LDD extension region. Therefore, the BVDSS of transistor 21 is greater than the BVDSS of transistor 27. As an example, the drain to source avalanche breakdown voltage of transistor 21 is approximately 23 volts. The drain to source avalanche breakdown voltage of transistor 27 is approximately 15 volts. Alternatively, the BVDSS of transistor 21 can be increased by using epitaxial layer 32 instead of doped region 44. In other words, instead of doping layer 32 with an impurity material of N conductivity type to form doped region 44, region 45 may be formed at a lateral distance of 0.5 microns from region 41 so that only epitaxial layer 32 is between regions 41 and 45.

Referring to FIG. 1, under normal operating conditions, i.e., in the absence of an Electrostatic Discharge (ESD) event, transistors 21 and 27 are nonconductive and protection circuit 20 behaves as an open circuit between node 25 and the source electrode of transistor 27. In other words, transistor 21 and active load circuit 22 are in a high impedance mode of operation and only conduct leakage currents that are in the nano-ampere range.

During an ESD event, electrostatic charge is transferred to terminal 11 and the voltage at terminal 11 increases to a level greater than the BVDSS of transistor 21. Transistor 21 enters avalanche breakdown and a breakdown current from the electrostatic charge flows through transistor 21. In other words, when the voltage at node 25 exceeds the BVDSS of transistor 21, the conduction path between the drain and source electrodes of transistor 21 conducts a breakdown current. The breakdown current is more than three orders of magnitude greater than the leakage current of the protection circuit operating in the high impedance mode of operation.

The breakdown current flows through resistor 26, thereby raising the voltage at the gate electrode of transistor 27. The voltage at the gate electrode of transistor 27 increases to a level greater than the threshold voltage of transistor 27, and transistor 27 turns on and is conductive. Resistor 26 provides a current limiting function. It should be noted that other elements can be used in place of or in combination with resistor 26 to produce a current limiting circuit for use in active load circuit 22. For example, resistor 26 can be replaced by a diode or diode-connected transistor.

As the breakdown current flows through resistor 26 and transistors 21 and 27, the voltage at the gate electrode of transistor 27 increases until it reaches the parasitic bipolar snapback voltage of transistor 27. Transistors 21 and 27 cooperate to provide a low resistance path between node 25 and the source electrode of transistor 27. Current is shunted through the low resistance path, thereby dissipating the electrostatic charge appearing at the gate electrode of power transistor 16.

Preferably, the breakdown voltage of transistor 21 is less than the stress voltage of power transistor 16 so that protection circuit 20 limits the voltage at node 25 to a level less than the stress voltage of power transistor 16. Protection circuit 20 has a higher breakdown voltage at node 25 compared to prior art protection circuits such as a grounded-gate MOS transistor or a capacitively-coupled gate MOS transistor ESD structures, which use conventional MOS or bipolar transistors. For example, a protection circuit using a single conventional MOS transistor has a breakdown voltage of approximately 15 volts. In this embodiment, protection circuit 20 has a breakdown voltage of approximately 23 volts. Further, protection circuit 20 reduces the capacitance at the gate electrode of power transistor 16, which is desirable in high frequency applications.

By now it should be appreciated that a protection circuit and a method for protecting a semiconductor device have been provided. An advantage of the present invention is that it provides a protection circuit having a relatively higher breakdown voltage and lower capacitance compared to prior art protection circuits. Thus, the protection circuit of the present invention can be used in high frequency applications.

What is claimed is:

1. A protection circuit, comprising:
   a first transistor having a control electrode, a first conduction electrode coupled to a node of the protection circuit for discharging an electrostatic charge, and a second conduction electrode coupled to the control electrode of the first transistor;
   a second transistor having a breakdown voltage less than a breakdown voltage of the first transistor, a control electrode coupled to a control electrode of the first transistor, a first conduction electrode coupled to the control electrode of the first transistor, and a second conduction electrode coupled to a power supply terminal; and
   a current limiting circuit coupled between the control electrode of the second transistor and the power supply terminal.

2. The protection circuit of claim 1, wherein the first transistor is a Laterally Diffused Metal Oxide Semiconductor (LDMOS) transistor.

3. The protection circuit of claim 1, wherein the first transistor has a conduction path between the first and second conduction electrodes of the first transistor and the conduction path includes a channel region, a heavily doped region, and a lightly doped region between the heavily doped region and the channel region.

4. The protection circuit of claim 1, wherein the second transistor is a Metal Oxide Semiconductor Field Effect Transistor (MOSFET).

5. An integrated circuit, comprising:
   a first transistor having a control electrode, a first conduction electrode coupled to a node of the integrated circuit, a second conduction electrode coupled to the control electrode of the first transistor, and a conduction path between the first and second conduction electrodes, wherein the conduction path includes a channel region, a heavily doped region, and a lightly doped region between the heavily doped region and the channel region; and
   an active load circuit coupled between the second conduction electrode of the first transistor and a power supply terminal.

6. The integrated circuit of claim 5, wherein the heavily doped region and lightly doped region form a drain of the first transistor.

7. The integrated circuit of claim 5, wherein the first transistor is a Laterally Diffused Metal Oxide Semiconductor (LDMOS) transistor.

8. The integrated circuit of claim 5, wherein the active load circuit includes:
   a second transistor having a control electrode coupled to the control electrode of the first transistor and a conduction path coupled between the second conduction electrode of the first transistor and the power supply terminal; and
   a current limiting circuit coupled between the control electrode of the second transistor and the power supply terminal.

9. The integrated circuit of claim 8, wherein the second transistor is a Metal Oxide Semiconductor Field Effect Transistor (MOSFET) having a breakdown voltage less than a breakdown voltage of the first transistor.

10. The integrated circuit of claim 8, wherein the current limiting circuit includes a resistor having a first terminal coupled to the control electrode of the second transistor and a second terminal coupled to the power supply terminal.

11. The integrated circuit of claim 5, wherein the heavily doped region has a doping concentration ranging between approximately $1\times10^{19}$ atoms/cm$^3$ and approximately $1\times10^{21}$ atoms/cm$^3$, and the lightly doped region has a doping concentration of less than approximately $1\times10^{17}$ atoms/cm$^3$.

12. The integrated circuit of claim 5, wherein the channel region is doped with an impurity material of a first conductivity type and the lightly doped region and the heavily doped region are doped with an impurity material of a second conductivity type.

13. A method for protecting a semiconductor device from an electrostatic charge, comprising the steps of:
   enabling a conduction path after a voltage of the electrostatic charge increases to a level greater than a breakdown voltage of the conduction path;
   conducting a breakdown current generated by the electrostatic charge through the conduction path;
   increasing a voltage at a conduction electrode of a transistor with the breakdown current to a level greater than a bipolar snapback voltage of the transistor; and
   dissipating the electrostatic charge through the conductive path and the transistor.

14. The method of claim 13, wherein the breakdown voltage is less than a stress voltage of the semiconductor device.

15. The method of claim 13, wherein the step of increasing includes conducting the breakdown current through a current limiting circuit to increase the voltage at the conduction electrode of transistor.

16. The method of claim 13, wherein the conduction path includes a channel region of a first conductivity type, a doped region of a second conductivity type, and an extension region between the channel region and the doped region and having a doping concentration less than the doping concentration of the doped region.

17. The method of claim 13, wherein the conduction path and the transistor are in a high impedance mode of operation while the voltage of the electrostatic charge is less than the breakdown voltage of the conduction path.

18. The method of claim 13, wherein the conduction path includes a channel region of a first conductivity type, a doped region of a second conductivity type, and an extension region between the channel region and the doped region and having a doping concentration less than the doping concentration of the doped region.

* * * * *

UNITED STATES PATENT AND TRADEMARK OFFICE
CERTIFICATE OF CORRECTION

PATENT NO. : 6,222,236 B1
DATED : April 24, 2001
INVENTOR(S) : Daniel J. Lamey

It is certified that error appears in the above-identified patent and that said Letters Patent is hereby corrected as shown below:

Column 6,
Line 56-61, delete "conduction path includes a channel region of a first conductivity type, a doped region of a second conductivity type, and an extension region between the channel region and the doped region and having a doping concentration less than the doping concentration of the doped region" and add -- step of dissipating includes the step of shunting the breakdown current through the conductive path and the transistor to limit the voltage of the electrostatic charge to a level less than a stress voltage of he semiconductor device. --.

Signed and Sealed this

Twenty-third Day of April, 2002

Attest:

JAMES E. ROGAN
*Director of the United States Patent and Trademark Office*

*Attesting Officer*